(12) United States Patent
Kitada et al.

(10) Patent No.: US 12,433,167 B2
(45) Date of Patent: Sep. 30, 2025

(54) PIEZOELECTRIC ELEMENT, DROPLET DISPENSING HEAD, ACTUATOR, AND VIBRATOR

(71) Applicant: SEIKO EPSON CORPORATION, Tokyo (JP)

(72) Inventors: Kazuya Kitada, Nagano (JP); Koji Ohashi, Nagano (JP); Yasuaki Hamada, Nagano (JP); Yoshiki Yano, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 252 days.

(21) Appl. No.: 18/163,310

(22) Filed: Feb. 2, 2023

(65) Prior Publication Data

US 2023/0255117 A1    Aug. 10, 2023

(30) Foreign Application Priority Data

Feb. 4, 2022  (JP) ................. 2022-016195

(51) Int. Cl.
| | |
|---|---|
| *B41J 2/14* | (2006.01) |
| *B41J 2/16* | (2006.01) |
| *H10N 30/00* | (2023.01) |
| *H10N 30/853* | (2023.01) |

(52) U.S. Cl.
CPC ...... *H10N 30/8561* (2023.02); *B41J 2/14233* (2013.01); *B41J 2/161* (2013.01); *H10N 30/708* (2024.05)

(58) Field of Classification Search
None
See application file for complete search history.

(56) References Cited

U.S. PATENT DOCUMENTS

| | | | | |
|---|---|---|---|---|
| 2006/0245746 | A1* | 11/2006 | Makii | .................. G03B 5/02 |
| | | | | 348/E5.046 |
| 2013/0250006 | A1 | 9/2013 | Sakai | |
| 2015/0177197 | A1* | 6/2015 | Kojima | ................ G01N 29/221 |
| | | | | 216/17 |

(Continued)

FOREIGN PATENT DOCUMENTS

| | | |
|---|---|---|
| JP | 2013-201407 A | 10/2013 |
| JP | 2016-220892 A | 12/2016 |

(Continued)

*Primary Examiner* — Erica S Lin
(74) *Attorney, Agent, or Firm* — Global IP Counselors, LLP

(57) ABSTRACT

A piezoelectric element includes: a first electrode formed at a vibration plate; a seed layer formed at the first electrode; a piezoelectric film containing potassium, sodium, and niobium and formed at the seed layer; and a second electrode formed at the piezoelectric film. The piezoelectric film contains lithium and one or more first transition elements. The seed layer contains bismuth. When the piezoelectric film is divided into two equal parts in a stacking direction, the second electrode side is defined as a first region, and the first electrode side is defined as a second region, a bismuth intensity obtained by SIMS measurement at a boundary between the first region and the second region is equal to or less than 1/500 of a maximum bismuth intensity obtained by the SIMS measurement of the piezoelectric film.

9 Claims, 7 Drawing Sheets

(56) References Cited

U.S. PATENT DOCUMENTS

| | | | |
|---|---|---|---|
| 2015/0231884 A1* | 8/2015 | Kobayashi | ............. B41J 2/1632 |
| | | | 29/25.35 |
| 2015/0280103 A1* | 10/2015 | Kobayashi | ......... H10N 30/8561 |
| | | | 347/68 |
| 2016/0346808 A1 | 12/2016 | Miyazawa et al. | |
| 2018/0358540 A1 | 12/2018 | Kitada | |
| 2020/0055088 A1 | 2/2020 | Okada | |

FOREIGN PATENT DOCUMENTS

| | | |
|---|---|---|
| JP | 2018-207064 A | 12/2018 |
| WO | 2018/155276 A1 | 12/2019 |

* cited by examiner

PIEZOELECTRIC ELEMENT, DROPLET DISPENSING HEAD, ACTUATOR, AND VIBRATOR

The present application is based on, and claims priority from JP Application Serial Number 2022-016195, filed Feb. 4, 2022, the disclosure of which is hereby incorporated by reference herein in its entirety.

BACKGROUND

1. Technical Field

The present disclosure relates to a piezoelectric element, a droplet dispensing head, an actuator, and a vibrator.

2. Related Art

In the related art, a piezoelectric element using a lead-free piezoelectric material instead of a lead-based piezoelectric material such as lead zirconate titanate has been developed. For example, JP-A-2013-201407 discloses a piezoelectric element using a lead-free piezoelectric material containing bismuth, iron, barium, and titanium. The piezoelectric element includes a composite oxide layer of the lead-free piezoelectric material and a buffer layer containing at least one of bismuth, iron, zinc, and nickel. The buffer layer is also called a seed layer, and has a function of aligning a crystal orientation of the composite oxide layer.

However, the piezoelectric element described in JP-A-2013-201407 has a problem in that it is difficult to improve electrical characteristics when potassium sodium niobate is used as a piezoelectric material. Specifically, potassium sodium niobate is one of promising lead-free piezoelectric materials. When the buffer layer is used for the composite oxide layer of potassium sodium niobate, elements contained in the buffer layer are easily diffused into the composite oxide layer by a heat treatment during manufacturing. When the elements of the buffer layer diffuse, the crystal orientation of the composite oxide layer is likely to be disturbed, and the electrical characteristics of the piezoelectric element may be deteriorated. That is, it has been required to improve the electrical characteristics in the piezoelectric element using potassium sodium niobate.

SUMMARY

A piezoelectric element includes: a first electrode formed at a substrate; a seed layer formed at the first electrode; a piezoelectric film containing potassium, sodium, and niobium and formed at the seed layer; and a second electrode formed at the piezoelectric film. The piezoelectric film contains lithium and one or more first transition elements. The seed layer contains bismuth. When the piezoelectric film is divided into two equal parts in a stacking direction, the second electrode side is defined as a first region, and the first electrode side is defined as a second region, a bismuth intensity obtained by SIMS measurement at a boundary between the first region and the second region is equal to or less than 1/500 of a maximum bismuth intensity obtained by the SIMS measurement of the piezoelectric film.

A droplet dispensing head includes: the piezoelectric element; a substrate; a nozzle plate in which a nozzle for dispensing droplets is formed; and a pressure chamber substrate forming a pressure chamber communicating with the nozzle. The substrate forms a part of a wall surface of the pressure chamber. The piezoelectric element is formed at the substrate.

An actuator includes: the piezoelectric element; a drive unit driven by the piezoelectric element; and a voltage application unit configured to apply a voltage to the piezoelectric element.

A vibrator includes the piezoelectric element; and a charge detection unit configured to detect an amount of charge generated by displacement of the piezoelectric element and output a signal corresponding to the amount of charge.

DESCRIPTION OF EXEMPLARY EMBODIMENTS

1. First Embodiment

In an embodiment described below, a piezoelectric element using a lead-free piezoelectric material, and a droplet dispensing head, a recording device, and the like including the piezoelectric element are exemplified and described with reference to the drawings. In each of the following drawings, X, Y, and Z axes, which are coordinate axes, are attached as necessary, a direction indicated by an arrow is defined as a +direction, and a direction opposite to the +direction is defined as a −direction. A +Z direction may be referred to as upper and a −Z direction may be referred to as lower, and a view from the +Z direction may be referred to as a plan view or a plane. For convenience of illustration, a size of each member is different from an actual size.

1.1. Recording Device

Figure 1:
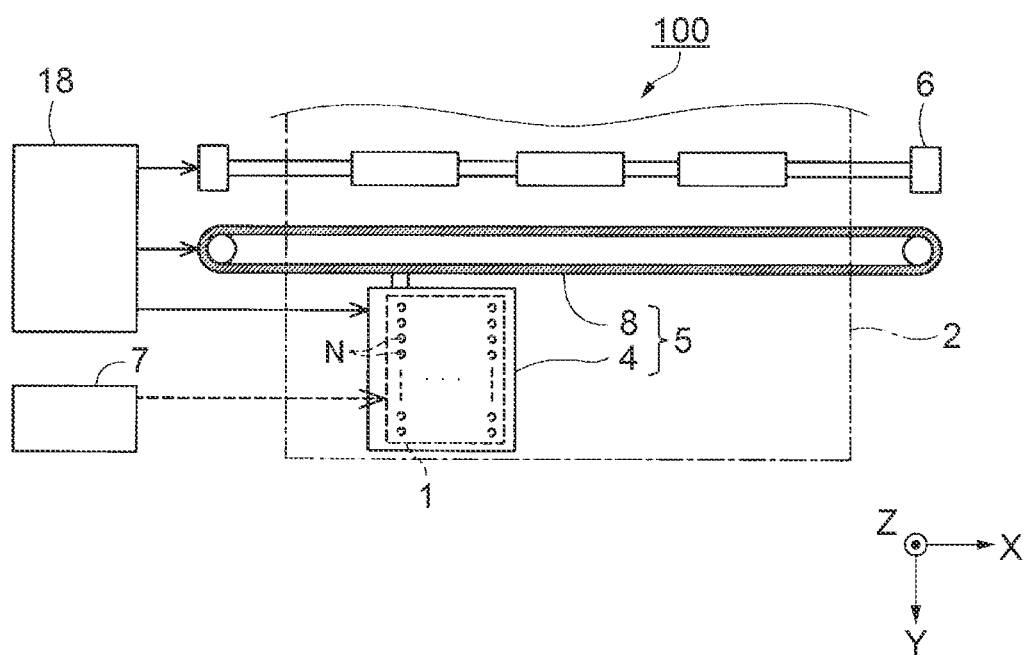
FIG. 1 is a schematic diagram showing a schematic configuration of a recording device including a droplet dispensing head according to a first embodiment.

As shown in FIG. 1, a recording device 100, which is an ink jet type printer, includes a droplet dispensing head 1 according to the present embodiment. The droplet dispensing head 1 includes a piezoelectric element 44 according to the present embodiment, which will be described later.

In the recording device 100, printing such as recording is performed by adhering ink droplets from the droplet dispensing head 1 to the recording medium 2. The recording device 100 includes, in addition to the droplet dispensing head 1, a head moving mechanism 5, a medium conveying mechanism 6, an ink housing unit 7, and a control unit 18.

The head moving mechanism 5 includes a carriage 4 and a timing belt 8. The droplet dispensing head 1 is mounted on the carriage 4. The carriage 4 is coupled to the timing belt 8. The timing belt 8 moves the carriage 4 in a direction along the X axis, which is a main scanning direction, by driving of a motor (not shown). Accordingly, the droplet dispensing head 1 can reciprocate in the direction along the X axis relative to the recording medium 2.

The medium conveying mechanism 6 conveys the recording medium 2 in a +Y direction, which is a sub-scanning direction. Accordingly, the recording medium 2 moves in the +Y direction relative to the droplet dispensing head 1.

The ink housing unit 7 houses ink dispensed from the droplet dispensing head 1. The ink housed in the ink housing unit 7 is supplied to the droplet dispensing head 1 via an ink pipe (not shown). A plurality of ink housing units 7 may be disposed corresponding to a plurality of types of inks exhibiting colors such as black, cyan, magenta, and yellow. Droplets dispensed from the droplet dispensing head 1 are not limited to ink, and may be droplets other than ink, such as treatment liquid and cleaning liquid.

The droplet dispensing head 1 is disposed on a side of the carriage 4 facing the recording medium 2. The droplet dispensing head 1 has a nozzle surface (not shown) on a surface facing the recording medium 2. A plurality of nozzles N are provided on the nozzle surface. The plurality of nozzles N form a row corresponding to the types of ink described above and the like.

The ink in the ink housing unit 7 is supplied to the droplet dispensing head 1, and is dispensed as droplets from the plurality of nozzles N by an actuator (described later) of the droplet dispensing head 1. The dispensed ink droplets land on and adhere to the recording medium 2.

The control unit 18 includes a plurality of processing circuits such as a central processing unit (CPU) and a field programmable gate array (FPGA), and a storage circuit such as a semiconductor memory. The control unit 18 controls the entire operation of the recording device 100. The head moving mechanism 5, the medium conveying mechanism 6, the droplet dispensing head 1, and the like are electrically coupled to the control unit 18, and are integrally controlled by the control unit 18.

As described above, an image and the like is printed on the recording medium 2 by causing ink to adhere to the recording medium 2 at a predetermined timing in correspondence with the movement of the droplet dispensing head 1 in the main scanning direction and the conveyance of the recording medium 2 in the sub-scanning direction.

In the present embodiment, a serial printer is exemplified as the recording device 100, and the recording device to which the droplet dispensing head 1 is applied is not limited thereto. For example, the droplet dispensing head according to the present disclosure may be a line head, and the recording device may be a line head printer. The device on which the droplet dispensing head according to the present disclosure is mounted is not limited to the recording device 100, and may be, for example, a device for manufacturing a color filter such as a liquid crystal display, an electrode forming device such as an organic electroluminescence display or a field emission display, or a biochip manufacturing device.

1.2. Droplet Dispensing Head

Figure 2:
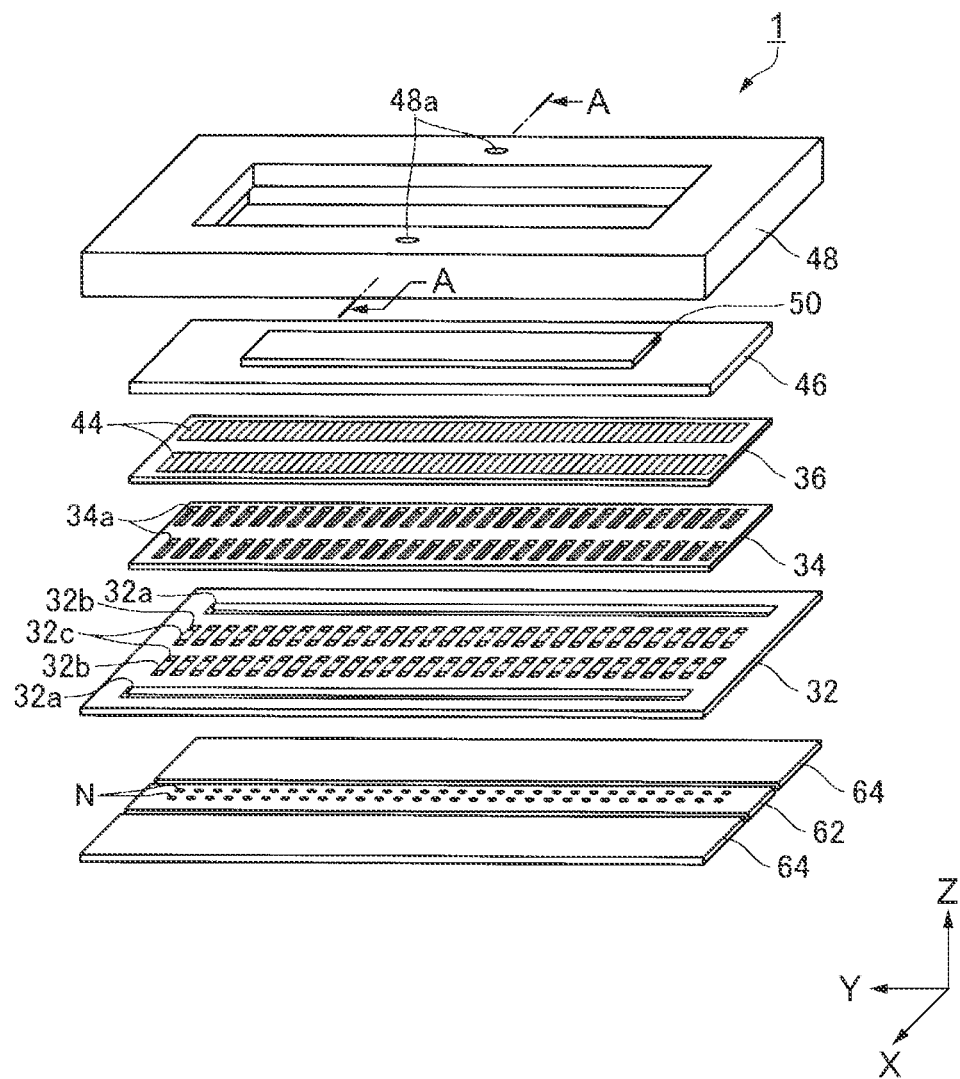
FIG. 2 is an exploded perspective view of the droplet dispensing head.

As shown in FIG. 2, the droplet dispensing head 1 includes a nozzle plate 62, two vibration absorbers 64, a flow path forming substrate 32, a pressure chamber substrate 34, the piezoelectric element 44, a vibration plate 36 as a substrate, a wiring substrate 46, a drive circuit 50, and a housing unit 48. The nozzle plate 62, the vibration absorbers 64, the flow path forming substrate 32, the pressure chamber substrate 34, the vibration plate 36, and the wiring substrate 46 are substantially rectangular plate-shaped members, and a longitudinal direction thereof is along the Y axis in a plan view.

During manufacturing of the droplet dispensing head 1, the nozzle plate 62, the two vibration absorbers 64, the flow path forming substrate 32, the pressure chamber substrate 34, the vibration plate 36, the wiring substrate 46, and the housing unit 48 are stacked in this order, and are bonded to one another by, for example, an adhesive.

The nozzle plate 62, the flow path forming substrate 32, the pressure chamber substrate 34, and the vibration plate 36 each have a substantially line-symmetric structure with respect to a center line in the direction along the X axis. In the plan view, sizes of the pressure chamber substrate 34, the vibration plate 36, and the wiring substrate 46 are smaller than sizes of the flow path forming substrate 32 and the housing unit 48.

The plurality of nozzles N are formed in the nozzle plate 62. The nozzle N is a through hole bored in the nozzle plate 62, and has a substantially circular shape in the plan view. The plurality of nozzles N are disposed along the Y axis, and two rows are disposed in the direction along the X axis. The two vibration absorbers 64 are disposed with the nozzle plate 62 interposed therebetween in the direction along the X axis. The two vibration absorbers 64 are flexible films.

The flow path forming substrate 32 includes two first opening portions 32a, a plurality of second opening portions 32b, and a plurality of third opening portions 32c. The first opening portions 32a have a substantially rectangular shape whose longitudinal direction is along the Y axis in a plan view. The first opening portions 32a are provided along a long side along the Y axis of the flow path forming substrate 32 in the plan view.

The plurality of second opening portions 32b are disposed in the direction along the Y axis to form two rows. Similarly, the plurality of third opening portions 32c are also disposed in the direction along the Y axis to form two rows. In the direction along the X axis, one first opening portion 32a, a row of the second opening portions 32b, a row of the third opening portions 32c, a row of the third opening portions 32c, a row of the second opening portions 32b, and the other first opening portion 32a are disposed in this order. In addition, the second opening portion 32b and the third opening portion 32c adjacent to each other in the direction along the X axis are disposed such that positions thereof in the direction along the Y axis are substantially the same.

The pressure chamber substrate 34 includes a plurality of opening portions 34a. The opening portion 34a has a substantially rectangular shape whose longitudinal direction is along the X axis in a plan view. The plurality of opening portions 34a are disposed in the direction along the Y axis to form two rows. The two rows of the plurality of opening portions 34a are disposed side by side in the direction along the X axis. Each of the opening portions 34a is provided at a position overlapping the second opening portion 32b and the third opening portion 32c adjacent to each other in the flow path forming substrate 32 in the plan view.

The piezoelectric element 44 is formed at the vibration plate 36. Specifically, a plurality of the piezoelectric elements 44 are disposed on an upper main surface of the vibration plate 36. Each of the plurality of piezoelectric elements 44 is provided at a position overlapping the corresponding one of the plurality of opening portions 34a of the pressure chamber substrate 34 in the plan view. Each opening portion 34a of the pressure chamber substrate 34 and a lower surface of the vibration plate 36 form a pressure chamber C, which will be described later.

The drive circuit 50 drives the piezoelectric elements 44. Specifically, the drive circuit 50 is an integrated circuit (IC) chip that outputs a reference voltage and a drive signal for driving the piezoelectric elements 44. The drive circuit 50 is mounted on an upper main surface of the wiring substrate 46. The wiring substrate 46 is provided with wiring for an input signal to the drive circuit 50, a drive signal output from the drive circuit 50, and the reference voltage.

A terminal (not shown) of the wiring substrate 46 and the piezoelectric element 44 are bonded to each other via bumps B to be described later. The input signal to the drive circuit 50 is input to the terminal via, for example, flexible printed circuits (FPC).

The housing unit 48 is a container that stores ink, and has a frame shape. When the droplet dispensing head 1 is assembled, the pressure chamber substrate 34, the vibration plate 36, and the wiring substrate 46 are disposed in an internal space of the housing unit 48. Through holes 48a are formed in both sides of the housing unit 48 in the direction along the X axis.

Figure 3:
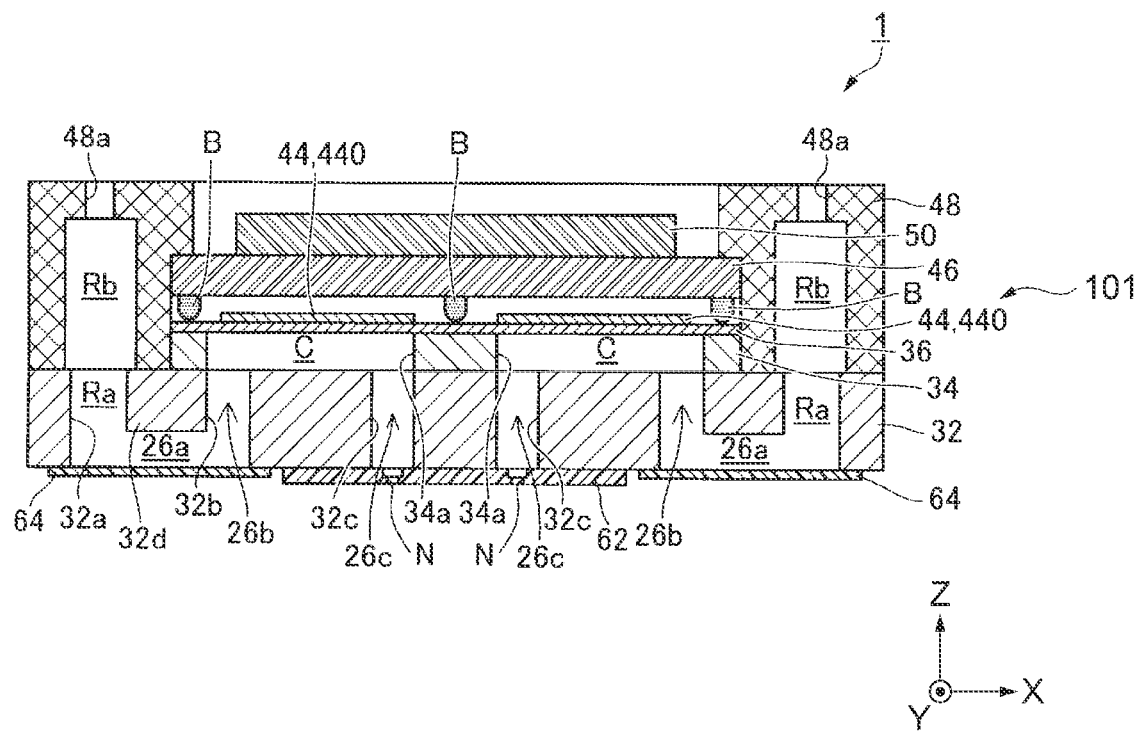
FIG. 3 is a cross-sectional view taken along an XZ plane including a line A-A in FIG. 2.

As shown in FIG. 3, the wiring substrate 46, the vibration plate 36, and the pressure chamber substrate 34 are housed in a frame-shaped inner portion of the housing unit 48. A frame-shaped outer edge of the housing unit 48 is in contact with the upper side of the flow path forming substrate 32. The nozzle plate 62 and the two vibration absorbers 64 are in contact with the lower side of the flow path forming substrate 32. Here, the droplet dispensing head 1 has a configuration that is left-right symmetric in FIG. 3. Therefore, in the following description, a configuration in a −X direction, which is the left side, will be described, and description of a configuration in a +X direction will be omitted.

Spaces Rb are formed in the vicinity of an end portion of the housing unit 48 in the −X direction. An upper portion of the space Rb communicates with the through hole 48a, and a lower portion of the space Rb communicates with the first opening portion 32a of the flow path forming substrate 32. The space Rb extends in the direction along the Y axis corresponding to a planar shape of the first opening portion 32a.

The flow path forming substrate 32 includes spaces Ra, partition walls 32d, supply flow paths 26b, and communication flow paths 26c. The space Ra is an internal space formed by the first opening portion 32a. The partition wall 32d is provided between the first opening portion 32a and the second opening portion 32b. A lower end portion of the partition wall 32d is located above a lower surface of the flow path forming substrate 32 and is recessed in the +Z direction. A supply liquid chamber 26a is formed by the lower end portion of the partition wall 32d and an upper surface of the vibration absorber 64. The supply flow path 26b is an internal space formed by the second opening portion 32b.

The pressure chamber C is formed by the opening portion 34a of the pressure chamber substrate 34, the lower surface of the vibration plate 36, and an upper surface of the flow path forming substrate 32. That is, the vibration plate 36 forms an upper wall surface which is a part of a wall surface of the pressure chamber C. The pressure chamber C communicates with the supply flow path 26b below an end portion of the pressure chamber C in the −X direction.

The communication flow path 26c is an internal space formed by the third opening portion 32c. The pressure chamber C communicates with the communication flow path 26c below the end portion of the pressure chamber C in the +X direction, and communicates with the nozzle N of the nozzle plate 62 via the communication flow path 26c.

As described above, the through hole 48a, the spaces Rb and Ra, the supply liquid chamber 26a, the supply flow path 26b, the pressure chamber C, the communication flow path 26c, and the nozzle N communicate with each other in this order to form an ink flow path. In the configuration forming the ink flow path described above, the supply liquid chamber 26a to the communication flow path 26c are provided corresponding to each of the plurality of nozzles N.

Ink is supplied to the through hole 48a from the ink housing unit 7 described above. The spaces Ra and Rb function as liquid storage chambers that store ink to be supplied to the pressure chamber C. The spaces Rb communicate with a plurality of the spaces Ra disposed along the Y axis. The ink supplied from the through hole 48a is stored in the space Ra via the space Rb. The ink stored in the space Ra is supplied to the pressure chamber C via the supply liquid chamber 26a and the supply flow path 26b.

The piezoelectric element 44 is disposed so as to overlap the pressure chamber C in the plan view. That is, the plurality of piezoelectric elements 44 are provided corresponding to a plurality of the pressure chambers C. The piezoelectric elements 44 include active portions 440 to be described later. The wiring substrate 46 is disposed above the piezoelectric elements 44, and the drive circuit 50 is disposed above the wiring substrate 46. The wiring substrate 46 and the piezoelectric elements 44 are electrically coupled by the bumps B.

The drive signal and the reference voltage are input from the wiring substrate 46 to the piezoelectric elements 44 via the bumps B. A voltage is applied to the piezoelectric elements 44 by the input of the drive signal and the reference voltage, and the piezoelectric elements 44 are deformed. The vibration plate 36 vibrates in conjunction with the deformation of the piezoelectric elements 44. Accordingly, the ink is dispensed from the nozzle N by the pressure fluctuation in the pressure chamber C.

The vibration plate 36 is driven by the piezoelectric elements 44. The drive circuit 50 described above applies the voltage to the piezoelectric elements 44. Here, the piezoelectric elements 44, the vibration plate 36 which is also a drive unit, and the drive circuit 50 which is a voltage application unit form an actuator 101 of the present embodiment. As will be described in detail later, since the piezoelectric elements 44 have improved electrical characteristics, the actuator 101 having excellent electrical characteristics can be provided. The actuator including the piezoelectric elements according to the present disclosure is not limited to the above-described configuration.

1.3. Piezoelectric Element

Figure 4:
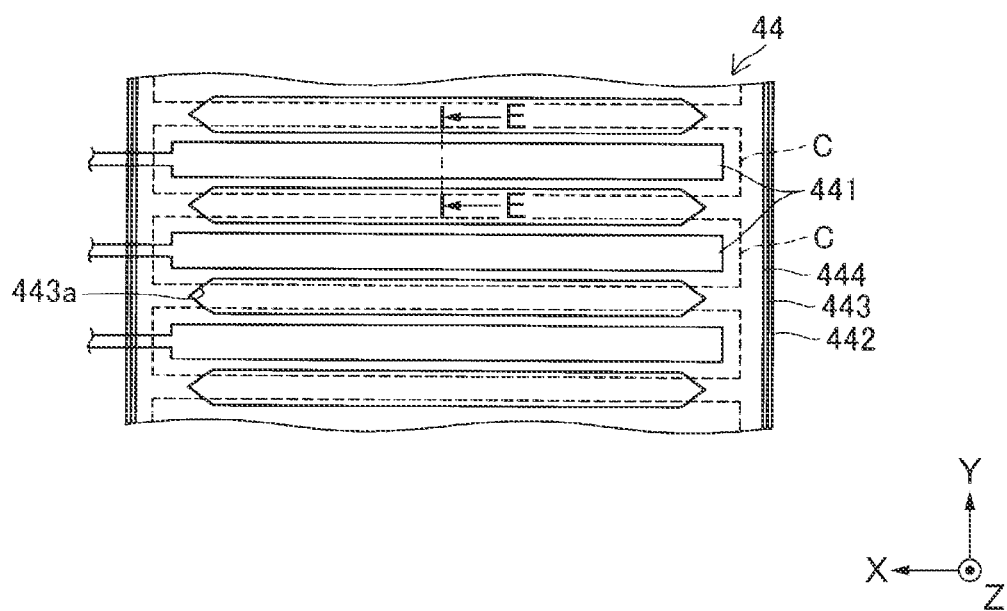
FIG. 4 is a plan view showing a configuration of a piezoelectric element.

As shown in FIG. 4, the piezoelectric element 44 according to the present embodiment includes first electrodes 441, a seed layer 442, a piezoelectric film 443, and a second electrode 444, and is formed at the vibration plate 36 as a substrate (not shown). As will be described in detail later, the first electrodes 441, the seed layer 442, the piezoelectric film 443, and the second electrode 444 are stacked in this order from the vibration plate 36 upward in a direction along the Z axis. In the following description of FIG. 4, unless otherwise specified, a plan view will be described.

The first electrodes 441 are disposed to overlap each of the pressure chambers C in the direction along the Z axis. The first electrode 441 is drawn out and extends from a substantially rectangular region overlapping the pressure chamber C in the +X direction. Although not shown, a plurality of the first electrodes 441 are individually electrically coupled to the drive circuit 50 described above at the end of extension in the +X direction.

In a manufacturing process of the piezoelectric element 44, the seed layer 442 and the piezoelectric film 443 are formed in a substantially flat shape so as to cover the plurality of first electrodes 441, and then only a region 443a is etched. That is, the seed layer 442 and the piezoelectric film 443 are not disposed in the region 443a. The region 443a has a substantially hexagonal shape elongated in the direction along the X axis, and is provided between the first electrodes 441 adjacent to each other in the direction along the Y axis.

The second electrode 444 is formed in a flat shape so as to cover the first electrodes 441, the seed layer 442, the piezoelectric film 443, and the region 443a. An individual voltage is applied to the first electrodes 441, whereas a common voltage is applied to the second electrode 444.

Figure 5:
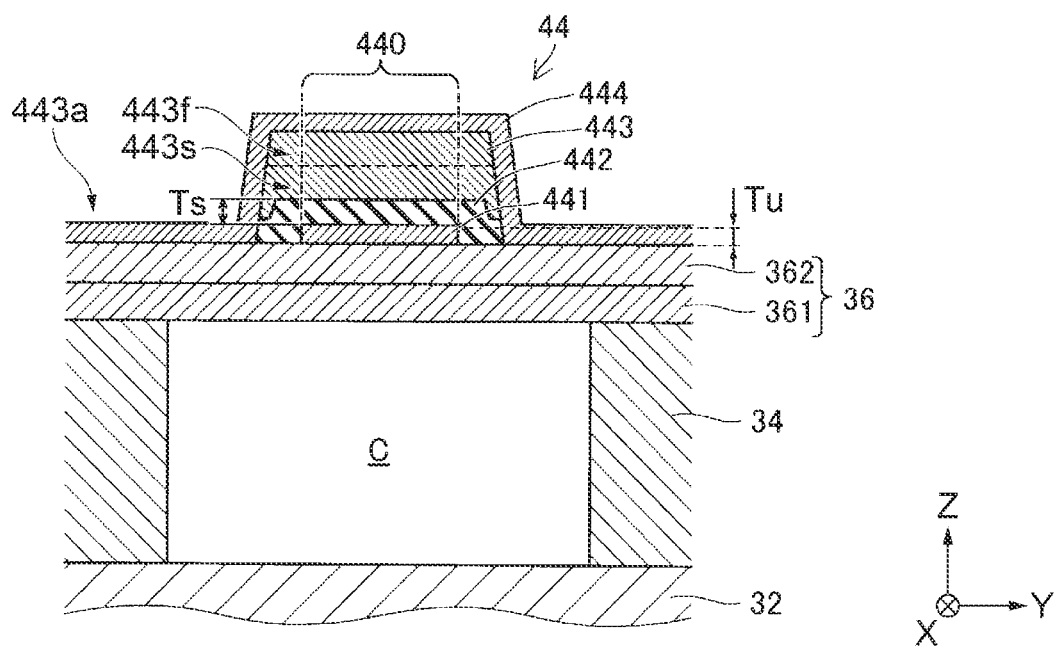
FIG. 5 is a cross-sectional view taken along an YZ plane including a line E-E in FIG. 4.

As shown in FIG. 5, the piezoelectric element 44 is formed by stacking the vibration plate 36, the first electrodes 441, the seed layer 442, the piezoelectric film 443, and the second electrode 444 in this order upward. Here, a region where the first electrodes 441, the seed layer 442, the piezoelectric film 443, and the second electrode 444 overlap in a plan view is referred to as the active portion 440.

The active portion 440 is a region where the piezoelectric film 443 is deformed when a voltage is applied between the first electrodes 441 and the second electrode 444. The active portion 440 faces the pressure chamber C via the vibration plate 36 in the direction along the Z axis.

The vibration plate 36 includes a silicon (Si) substrate 361 and an insulator layer 362. The silicon substrate 361 is made of a silicon single crystal. Instead of the silicon substrate 361, a silicon on insulator (SOI) substrate, a glass substrate, and the like may be adopted.

The insulator layer 362 is made of zirconium oxide ($ZrO_2$). Although not shown, a layer of silicon oxide ($SiO_2$) is provided on an upper surface of the silicon substrate 361 in contact with the insulator layer 362.

The first electrodes 441 are formed at the vibration plate 36. That is, the first electrode 441 is disposed in contact with an upper surface of the insulator layer 362 of the vibration plate 36. Although not shown, the first electrode 441 is formed of a platinum (Pt) layer and an iridium (Ir) layer. The first electrode 441 is not limited to the configuration formed of the platinum layer and the iridium layer. The first electrode 441 may be, for example, a single layer of metal materials such as titanium (Ti), platinum, iridium, aluminum (Al), nickel (Ni), gold (Au), and copper (Cu), or may have a configuration in which two or more single layers of the metal materials are stacked.

A thickness Tu of the first electrode 441 is preferably, for example, 20 nm or more and 300 nm or less.

The seed layer 442 controls to align a crystal orientation of a composite oxide in the piezoelectric film 443. The seed layer 442 promotes a preferential orientation of a crystal of the piezoelectric film 443 to a (100) plane. The seed layer 442 is formed at the first electrode 441 and covers an upper side and a side of the first electrode 441. The seed layer 442 is preferably a composite oxide containing bismuth (Bi), titanium, iron (Fe), and lead (Pb) and having a perovskite structure.

Specifically, the seed layer 442 is preferably a composite oxide represented by a general formula $Pb_xBi_{(a-x)}Fe_yTi_{(b-y)}O_z$ and satisfying a>x and b>y. Here, x/(a−x) preferably satisfies the following Formula (1). When the seed layer 442 contains these elements, the orientation of the crystal of the composite oxide is promoted in the piezoelectric film 443. Accordingly, the electrical characteristics of the piezoelectric element 44 can be further improved.

$$0.04 < x/(a-x) < 1.40 \quad (1)$$

x/(a−x) more preferably satisfies the following Formula (2) in order to orient the composite oxide of the piezoelectric film 443 to the (100) plane.

$$x/(a-x) < 0.72 \quad (2)$$

In addition, it is preferable that b=1, a/b satisfies the following Formula (3), and z satisfies the following Formula (4).

$$0.8 < (a/b) < 1.4 \quad (3)$$

$$2.8 < z < 3.2 \quad (4)$$

The composition of the seed layer 442 is not particularly limited, and for example, a molar ratio of each element is set to 0.1 for lead, 1.1 for bismuth, 0.5 for iron, 0.5 for titanium, and 3.0 for oxygen (O). These compositions are adjusted by, for example, a molar ratio of each element in a precursor solution of the seed layer 442 when the seed layer 442 is formed. Since the seed layer 442 has a relatively high dielectric constant, a displacement efficiency indicated by a displacement amount of the piezoelectric film 443 with respect to the applied voltage is high.

In the related art, in a buffer layer, elements constituting the buffer layer may easily diffuse into a composite oxide of a piezoelectric body due to a heat treatment and the like in a manufacturing process of the piezoelectric body. When elements having different valences enter the composite oxide due to the diffusion of the elements, a high concentration defect is likely to occur in a crystal of the piezoelectric body. Accordingly, it is difficult to move a domain wall, and the displacement and polarization are reduced, such that electrical characteristics of the piezoelectric body may be reduced. In particular, when the diffusion of bismuth into a composite oxide of potassium sodium niobate is remarkable, the above-described problem tends to be obvious.

On the other hand, in the piezoelectric element 44, since lithium (Li) is contained in potassium sodium niobate ((K, Na)$NbO_3$) of the piezoelectric film 443, the occurrence of the above-described problem is prevented. A method of manufacturing the piezoelectric element 44 and the configuration of the piezoelectric film 443 will be described later.

A thickness Ts of the seed layer 442 is thinner than the thickness Tu of the first electrode 441. In the seed layer 442 containing bismuth, titanium, iron, and lead, even if the thickness is relatively thin, an effect of aligning the crystal orientation of the piezoelectric film 443 is ensured. Therefore, the diffusion of bismuth into the piezoelectric film 443 can be further prevented by making the thickness Ts of the seed layer 442 smaller than the thickness Tu of the first electrode 441. The thickness Ts of the seed layer 442 is preferably 5 nm or more and 200 nm or less, and more preferably 5 nm or more and 100 nm or less.

The seed layer 442 is not limited to the perovskite structure. The seed layer 442 may have an octahedral crystal structure, in which six oxygen atoms are coordinated to iron or titanium, as a structure similar to the perovskite structure. Examples of such a crystal structure include a bismuth layered structure. In addition, the seed layer 442 may contain a composite oxide that does not contain one or more of bismuth, titanium, iron, and lead. Further, the seed layer 442 may contain a composite oxide in which any one of bismuth, titanium, iron, and lead is partially substituted within a range where the crystal orientation is not collapsed.

The piezoelectric film 443 is a main part of the piezoelectric element 44 having piezoelectricity, and is deformed by application of a voltage. The piezoelectric film 443 is formed at and in contact with the seed layer 442 and covers an upper side of the seed layer 442. The piezoelectric film 443 contains potassium (K), sodium (Na), and niobium (Nb), and is mainly formed of a composite oxide having a perovskite structure represented by a general formula $ABO_3$. Specifically, the composite oxide is represented by the following Formula (5).

$$(K_m,Na_{1-n})NbO_3 \qquad (5)$$

However, Formula (5) satisfies $0.1 \leq m \leq 0.9$.

The potassium sodium niobate composite oxide of Formula (5) is a lead-free piezoelectric material in which a content of lead and the like is reduced, and is a so-called KNN composite oxide. The KNN composite oxide is advantageous for reducing an environmental load, and is excellent in piezoelectric characteristics as compared with other lead-free piezoelectric materials. Further, the KNN composite oxide has a Curie temperature higher than other lead-free piezoelectric materials such as BNT-BKT-BT, and is less likely to undergo depolarization due to temperature rise, which is advantageous for use at high temperatures.

In Formula (5), a content of potassium is preferably 30 mol % or more and 70 mol % or less with respect to a total amount of metal elements constituting an A site of $ABO_3$. That is, m preferably satisfies $0.3 \leq m \leq 0.7$. The content of potassium is more preferably 40 mol % or more and 60 mol % or less with respect to the total amount of the metal elements constituting the A site. That is, m more preferably satisfies $0.4 \leq m \leq 0.6$. Accordingly, the piezoelectric characteristics of the piezoelectric film 443 are improved.

The piezoelectric film 443 contains lithium and one or more first transition elements in addition to the KNN composite oxide of Formula (5). Examples of the first transition element include scandium (Sc), titanium (Ti), vanadium (V), chromium (Cr), manganese (Mn), iron, cobalt (Co), nickel (Ni), copper (Cu), and zinc (Zn).

The above elements may be contained in the KNN composite oxide of Formula (5) as an additive. Specifically, the KNN composite oxide contained in the piezoelectric film 443 is not limited to the composition represented by Formula (5), and may have a composition represented by, for example, the following Formula (6).

$$\{K_n,Na_{1-n}\}_{q-o},Li_o\}(Nb_{1-p},M_p)O_3 \qquad (6)$$

Wherein, M represents the first transition element, and satisfies $0.1 \leq n \leq 0.9$, $0.9 \leq q \leq 1.2$, $0.03 \leq o \leq 0.05$, and $p \leq 0.05$.

When the piezoelectric film 443 contains lithium, diffusion of an element such as bismuth in the seed layer 442 into the piezoelectric film 443 is reduced in a heat treatment step and the like of the manufacturing process of the piezoelectric element 44. Accordingly, the piezoelectric characteristics of the piezoelectric element 44 are improved. A content of lithium in the piezoelectric film 443 is preferably 10 mol % or less.

Here, the piezoelectric film 443 is vertically divided into two equal parts in the direction along the Z axis which is a stacking direction. An upper part of the piezoelectric film 443 on the second electrode 444 side is referred to as a first region 443f and a lower part of the piezoelectric film 443 on the first electrode 441 side is referred to as a second region 443s. When an element concentration of the piezoelectric film 443 in a depth direction from the upper surface is measured by secondary ion mass spectrometry (SIMS), an intensity of bismuth measured by SIMS at a boundary between the first region 443f and the second region 443s is equal to or less than 1/500 of a maximum bismuth intensity of the piezoelectric film 443 measured by SIMS.

Bismuth diffuses from the seed layer 442 into the piezoelectric film 443. Therefore, the maximum bismuth intensity in the piezoelectric film 443 described above is measured on a surface of the piezoelectric film 443 on the seed layer 442 side. In other words, in the piezoelectric film 443, a concentration of bismuth is high on the surface in contact with the seed layer 442, and the concentration of bismuth decreases upward. Since the bismuth intensity at the boundary between the first region 443f and the second region 443s is reduced to 1/500 or less of the bismuth intensity of the surface of the piezoelectric film 443 in contact with the seed layer 442, a high concentration defect is less likely to occur in the crystal of the piezoelectric film 443. Therefore, the piezoelectric characteristics of the piezoelectric element 44 are improved.

In addition, since the piezoelectric film 443 includes one or more first transition elements, a leakage current in the piezoelectric element 44 is reduced. Accordingly, the electrical characteristics of the piezoelectric element 44 are improved.

The piezoelectric film 443 contains potassium, sodium, and niobium, and may include a piezoelectric material which is a mixed crystal of a composite oxide having a perovskite structure represented by the general formula $ABO_3$ and another composite oxide having a perovskite structure represented by the general formula $ABO_3$. In addition, the piezoelectric material included in the piezoelectric film 443 may include a material having a composition in which a part of the above-described elements is deficient, a material having a composition in which a part of the above-described elements is excessive, and the like.

The piezoelectric film 443 is crystal oriented in a {100} orientation. That is, the piezoelectric film 443 is preferentially oriented in the (100) plane. Accordingly, the piezoelectric characteristics of the piezoelectric element 44 are further improved. Here, in the present specification, the term "preferentially oriented" means that 50% or more, preferably 80% or more of crystals are oriented in a predetermined crystal plane. Specifically, the term "preferentially oriented in the (100) plane" includes a case where all the crystals of the piezoelectric film 443 are oriented in the (100) plane and a case where at least 50% of the crystals are oriented in the (100) plane. The crystal orientation of the piezoelectric film 443 can be known by analyzing an X-ray diffraction pattern obtained by an X-ray diffraction method. A thickness of the piezoelectric film 443 is, for example, 50 nm or more and 2000 nm or less.

The second electrode 444 is formed at the piezoelectric film 443. The second electrode 444 is provided to cover an upper side and a side of the piezoelectric film 443, a part of a side of the seed layer 442, and an upper side of the vibration plate 36 in the region 443a. The second electrode 444 is formed of a platinum layer. The second electrode 444 is not limited to being formed of the platinum layer, and may be, for example, a single layer of metal materials such as iridium, aluminum, nickel, gold, and copper, or may have a configuration in which two or more single layers of the metal materials are stacked.

In the present embodiment, the piezoelectric element 44, in which the first electrodes 441, the seed layer 442, the piezoelectric film 443, and the second electrode 444 are sequentially stacked on the vibration plate 36, is exemplified, and the present disclosure is not limited thereto. The piezoelectric element according to the present disclosure may be, for example, a longitudinal vibration type piezoelectric element in which a piezoelectric material, an electrode forming material, and the like are alternately stacked and which expands and contracts in an axial direction.

1.4. Method of Manufacturing Piezoelectric Element

Hereinafter, an example of the method of manufacturing the piezoelectric element 44 will be described. First, the vibration plate 36 is produced. Specifically, the silicon substrate 361 is thermally oxidized to form silicon oxide on an upper surface of the silicon substrate 361. Next, the silicon oxide is coated with a zirconium layer by a sputtering method, and then the zirconium layer is thermally oxidized to form a zirconium oxide layer which is the insulator layer 362.

Next, the first electrode 441 is formed. Specifically, the platinum layer and then the iridium layer are stacked in a flat shape in this order on an upper surface of the insulator layer 362 by the sputtering method. Thereafter, the platinum layer and the iridium layer are patterned by a photolithography method. Specifically, a resist is applied onto the iridium layer and exposed to light, and the platinum layer and the iridium layer are subjected to ion milling. Next, the resist is removed by oxygen plasma asking, and cleaning is performed.

Next, a layer to be the seed layer 442 is formed by a metal organic decomposition (MOD) method. Specifically, a propionic acid solution of lead, bismuth, iron, and titanium is prepared as the precursor solution of the seed layer 442. At this time, the molar ratio of each element is, for example, lead:bismuth:iron:titanium=10:110:50:50. The propionic acid solution is applied onto the vibration plate 36 on which the first electrode 441 is formed by a spin coating method. Next, after drying and degreasing is performed at 350° C. using a hot plate, a heat treatment is performed at 650° C. for 3 minutes by rapid thermal annealing (RTA) using an infrared lamp and the like. Accordingly, a flat layer including the seed layer 442 is formed.

Next, a layer to be the piezoelectric film 443 is formed by a solution method. First, the precursor solution of the piezoelectric film 443 is prepared. The precursor solution contains a metal complex of each of potassium, sodium, niobium, lithium, and the first transition element as a solute. The solvent of the precursor solution is an organic solvent capable of dissolving or dispersing each metal complex. In the present embodiment, manganese is used as the first transition element.

Specifically, as the metal complex, potassium 2-ethylhexanoate, sodium 2-ethylhexanoate, niobium 2-ethylhexanoate, lithium 2-ethylhexanoate, manganese 2-ethylhexanoate, and the like is used. As the solvent, a simple organic solvent such as 2-n-butoxyethanol or n-octane or a mixed solution thereof is used. A content of each metal complex in the precursor solution corresponds to a desired molar ratio of each element of the piezoelectric film 443.

The precursor solution is applied onto the layer including the seed layer 442 by the spin coating method. Next, drying is performed at 180° C. using a hot plate, degreasing is performed at 380° C., and then a heat treatment is performed at 700° C. for 3 minutes by RTA. Accordingly, crystallization of the composite oxide of the piezoelectric film 443 is promoted. Then, a flat layer including the piezoelectric film 443 is formed. In order to increase the thickness of the piezoelectric film 443, steps from the application of the precursor solution to the heat treatment by RTA may be repeated.

Next, the above-described region 443a is provided by patterning. Specifically, in the layer including the seed layer 442 and the layer including the piezoelectric film 443, a region corresponding to the region 443a is removed to form the seed layer 442 and the piezoelectric film 443. As a patterning method, dry etching such as reactive ion etching or ion milling, wet etching using an etching solution, and the like can be used.

Next, the second electrode 444 is formed above the piezoelectric film 443 and the region 443a. Specifically, similarly to the first electrode 441, a platinum layer is provided by the sputtering method to form the second electrode 444. As described above, the piezoelectric element 44 is manufactured.

According to the present embodiment, the following effects can be obtained.

Since the piezoelectric film 443 contains lithium, the diffusion of bismuth contained in the seed layer 442 into the piezoelectric film 443 is prevented. In particular, the concentration of bismuth diffused into the piezoelectric film 443 is maximum in the vicinity of the surface on the seed layer 442 side, and decreases from the seed layer 442 side toward the second electrode 444 side. Therefore, by setting the bismuth intensity of the boundary between the first region 443f and the second region 443s to be equal to or less than $1/500$ of the bismuth intensity of the surface on the seed layer 442 side, the concentration of bismuth in the piezoelectric film 443 is reduced, and the piezoelectric characteristics and the like of the piezoelectric element 44 are improved. In addition, when the piezoelectric film 443 includes one or more first transition elements such as manganese, the leakage current can be reduced. As described above, it is possible to provide the piezoelectric element 44, in which the electrical characteristics are improved, the droplet dispensing head 1, and the actuator 101.

2. Example and Comparative Examples

Hereinafter, the effects of the above-described embodiment will be described in more detail with reference to Example and Comparative Examples.

2.1. Manufacturing of Piezoelectric Element

In the piezoelectric element 44 of Example 1, the molar ratio of each element contained in the piezoelectric film 443 was potassium:sodium:lithium:niobium:manganese=0.5151:0.4949:0.0500:0.9950:0.0050. In addition, the steps from the application of the precursor solution to the heat treatment by RTA were repeated five times. Except for these conditions, the piezoelectric element of Example 1 was manufactured in the same manner as in the method of manufacturing the piezoelectric element 44 described above.

In the piezoelectric element of Comparative Example 1, lithium was removed from the elements contained in the piezoelectric film 443 of Example 1, and the molar ratio of each element contained in the piezoelectric film was potassium:sodium:niobium:manganese=0.54:0.52:0.995:0.005. Except for these conditions, a piezoelectric element of Comparative Example 1 was manufactured in the same manner as the piezoelectric element 44 of Example 1.

In a piezoelectric element of Comparative Example 2, the piezoelectric element of Comparative Example 2 was manufactured in the same manner as the piezoelectric element 44 of Example 1 except that the seed layer 442 was omitted.

2.2. Evaluation of Piezoelectric Element

2.2.1. Crystal Orientation of Piezoelectric Film

For the piezoelectric films of the piezoelectric elements of Example 1 and Comparative Examples 1 and 2, a state of a crystal orientation was investigated by an X-ray diffraction intensity curve measured by an X-ray diffraction (XRD) method. In this analysis, a sample collected before the formation of the second electrode after the formation of the piezoelectric film in the method of manufacturing the piezoelectric element was used.

As an X-ray diffraction device, D8 DISCOVER with GADDS manufactured by Bruker was used. Measurement conditions were a tube voltage of 50 kV, a tube current of 100 mA, a detector distance of 15 cm, a collimator diameter of 0.3 mm, and a measurement time of 120 seconds. The obtained two-dimensional data was converted into the X-ray diffraction intensity curve by software attached to the device with a 2θ range of 20° to 50°, a χ range of −95° to −85°, a step width of 0.02°, and an intensity normalization method of Bin normalized.

As a result, in the X-ray diffraction intensity curves of Example 1 and Comparative Example 1, it was confirmed that a peak intensity of the (100) plane was strong and the composite oxide of the piezoelectric film was preferentially oriented to the (100) plane. On the other hand, in the X-ray diffraction intensity curve of Comparative Example 2, the peak intensity of the (100) plane was very weak, and peaks of a (110) plane were mixed. Therefore, it was found that the composite oxide of the piezoelectric film of Comparative Example 2 was randomly oriented. Accordingly, the effectiveness of the seed layer with respect to the crystal orientation of the piezoelectric film is shown.

2.2.2. Diffusion of Bismuth from Seed Layer to Piezoelectric Film

The piezoelectric films of the piezoelectric elements of Example 1 and Comparative Example 1 were subjected to composition analysis in the −Z direction, which is a depth direction from the surface on the second electrode side toward the seed layer side, by SIMS.

As an SIMS device, a sector type SIMS IMS-7f manufactured by CAMECA was used. In the measurement, a cesium ion (Cs$^+$) of 15 kV was used as a primary ion, and a beam current of 10 nA was raster-scanned to a 100 μm square to detect a negative secondary ion from a center of 33 μmφ. During measurement, charge-up was prevented using an electron gun.

Figure 6:
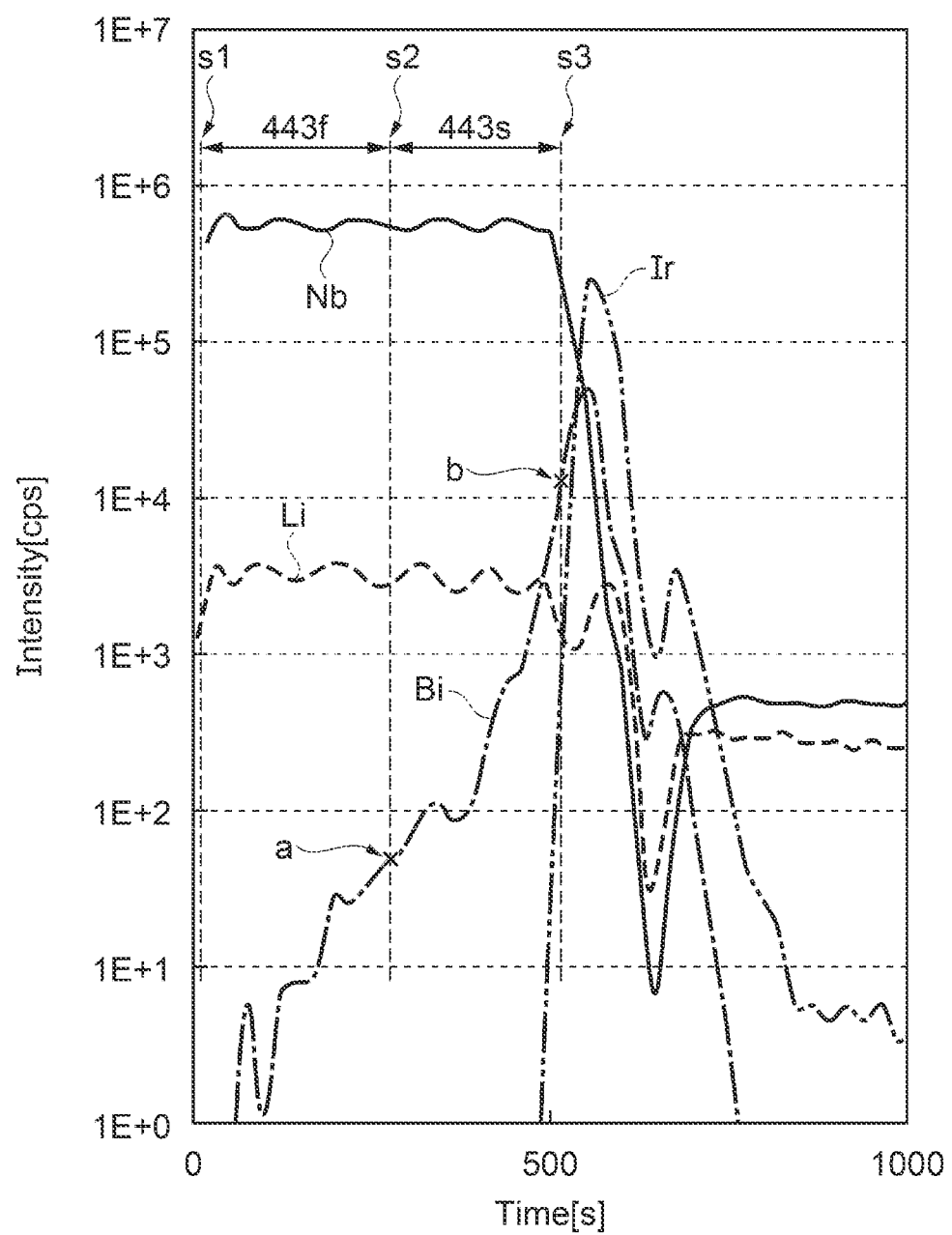
FIG. 6 is a diagram showing a profile in a depth direction of Example 1 obtained by SIMS measurement.
Figure 7:
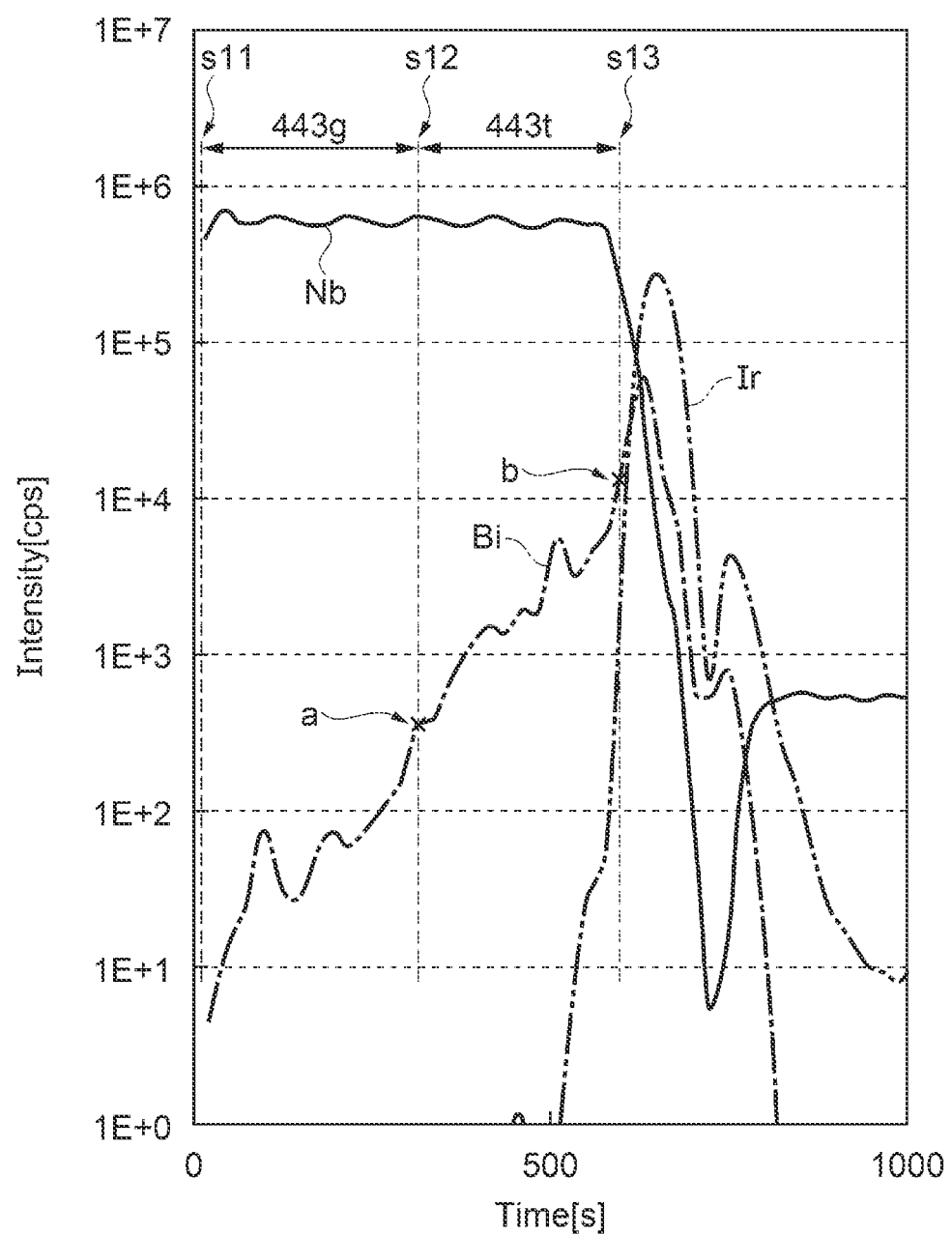
FIG. 7 is a diagram showing a profile in a depth direction of Comparative Example 1 obtained by the SIMS measurement.

The obtained depth direction profile is shown in FIGS. 6 and 7. For convenience of illustration, only niobium, bismuth, iridium, and lithium are shown in FIG. 6 of Example 1, and only niobium, bismuth, and iridium are shown in FIG. 7 of Comparative Example 1. In FIGS. 6 and 7, a horizontal axis represents a time (seconds) for which digging proceeds in the depth direction, and can be regarded as a distance in the −Z direction. A vertical axis represents a detection intensity of each element.

As shown in FIG. 6, in Example 1, a boundary s1 at which niobium starts to be detected is the surface of the piezoelectric film 443 on the second electrode 444 side, and a boundary s3 at which the intensity of niobium rapidly decreases is the surface of the piezoelectric film 443 on the seed layer 442 side. Therefore, when the piezoelectric film 443 is divided into two equal parts in terms of distance in the direction along the Z axis which is the stacking direction, the part on the second electrode 444 side is the first region 443*f* and the part on the first electrode 441 side is the second region 443*s* with a boundary s2 as a boundary.

A maximum bismuth (Bi) intensity b in the piezoelectric film 443 was detected at the boundary s3 and was about 47800 cps. The bismuth intensity gradually decreased from the boundary s3 toward the boundary s1, and a bismuth (Bi) intensity a at the boundary s2 was about 88 cps. The bismuth intensities a and b and a numerical value a/b obtained by dividing the bismuth intensity a by the maximum bismuth intensity b are shown in Table 1. In Example 1, a/b was 0.00184, which was 1/500, that is, 0.0020 or less.

TABLE 1

|  | Example 1 | Comparative Example 1 |
|---|---|---|
| Bi intensity a at boundary between first region and second region | 88 | 395 |
| Maximum Bi intensity b in piezoelectric film | 47800 | 58600 |
| a/b | 0.00184 | 0.00674 |

As shown in FIG. 7, in Comparative Example 1, a boundary s11 at which niobium starts to be detected is the surface of the piezoelectric film on the second electrode side, and a boundary s13 at which the intensity of niobium rapidly decreases is the surface of the piezoelectric film on the seed layer side. Therefore, when the piezoelectric film is divided into two equal parts in terms of distance in the direction along the Z axis which is the stacking direction, the part on the second electrode side is a first region 443*g* and the part on the first electrode side is a second region 443*t* with a boundary s12 as a boundary.

The maximum bismuth (Bi) intensity b in the piezoelectric film was detected at the boundary s13 and was about 58600 cps. The bismuth intensity gradually decreased from the boundary s13 toward the boundary s11, and the bismuth (Bi) intensity a at the boundary s12 was about 395 cps. The bismuth intensities a and b and the numerical value a/b obtained by dividing the bismuth intensity a by the maximum bismuth intensity b are shown in Table 1. In Comparative Example 1, a/b was 0.00674, which exceeded 1/500, that is, 0.0020.

From the above, it was shown that the diffusion of bismuth from the seed layer 442 to the piezoelectric film 443 was prevented in Example 1 as compared with Comparative Example 1. Accordingly, it was found that the prevention of the diffusion of bismuth is advantageous in improving the electrical characteristics of the piezoelectric element 44 of Example 1 with respect to the piezoelectric element of Comparative Example 1.

2.2.3. Diffusion of Bismuth from Seed Layer to Piezoelectric Film

The piezoelectric elements of Example 1 and Comparative Example 1 were subjected to hysteresis measurement of an applied electric field and polarization. Specifically, in Example 1, a probe was applied to each of the first electrode 441 and the second electrode 444, the first electrode 441 was used as a positive electrode, the applied electric field was adjusted to 300 kV/cm at a frequency of 66 Hz, and a history curve was measured. The results are shown by solid lines in FIG. 8. In Comparative Example 1, the history curve was measured in the same manner as in Example 1, and the results were indicated by broken lines in FIG. 8.

Figure 8:
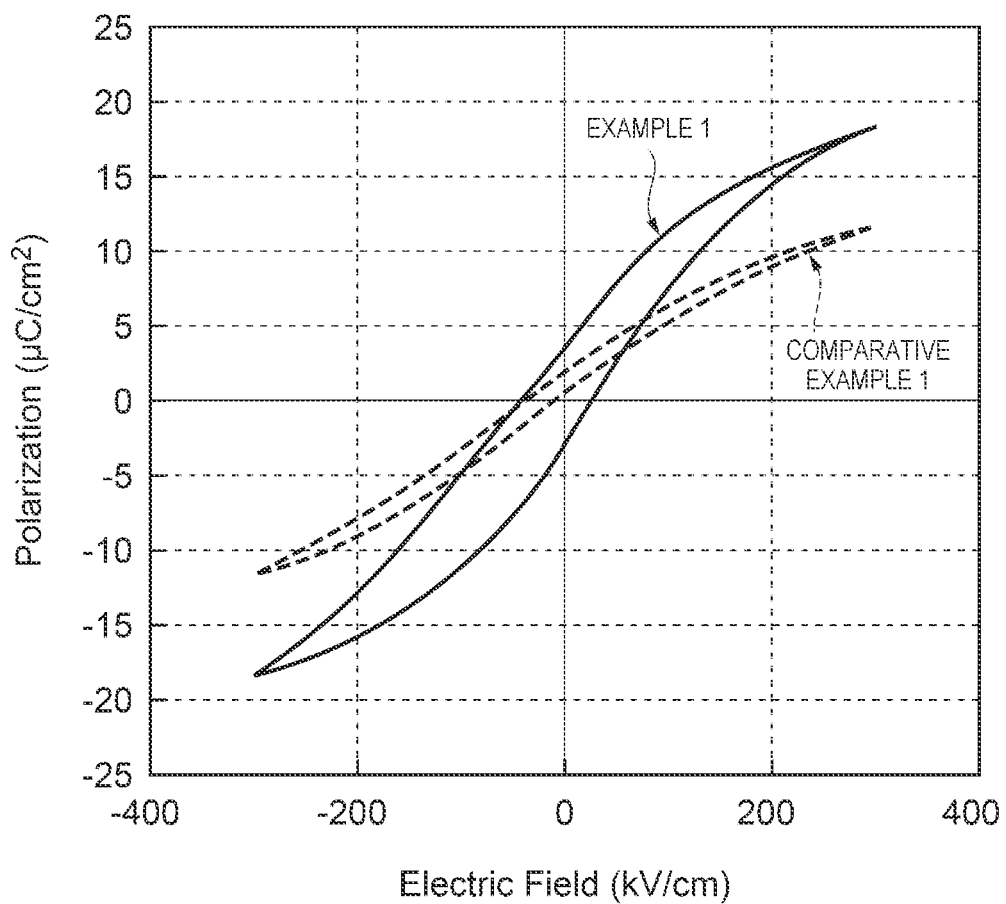
FIG. 8 is a graph of history curves showing relationships between an applied electric field and polarization in Example 1 and Comparative Example 1.

As shown in FIG. 8, it was shown that a saturation polarization amount and a residual polarization amount in Example 1 were larger than those in Comparative Example 1, and ferroelectric properties in Example 1 were excellent.

3. Second Embodiment

In the above-described embodiment, the droplet dispensing head 1 to which the piezoelectric element 44 is applied and the recording device 100 are exemplified, and the application of the piezoelectric element according to the present disclosure is not limited thereto. The piezoelectric element according to the present disclosure can be applied to an ultrasonic sensor, a piezoelectric motor, an ultrasonic motor, a piezoelectric transformer, a vibratory dust removing device, a pressure-electric converter, an ultrasonic transmitter, a pressure sensor, an acceleration sensor, and the like.

Specifically, the piezoelectric element according to the present disclosure may be applied to a vibrator. The vibrator of the present embodiment includes the piezoelectric element 44 of the above-described embodiment, and includes a charge detection unit that detects an amount of charge generated by displacement of the piezoelectric element 44 and outputs a signal corresponding to the detected amount of charge. Accordingly, since the piezoelectric characteristics of the piezoelectric element 44 and electrical characteristics such as reduction of a leakage current are improved, it is possible to provide a vibrator excellent in vibration characteristics and detection sensitivity.

The piezoelectric element according to the present disclosure may be mounted on a power generator. Examples of the power generator include a power generator using a pressure-electric conversion effect, a power generator using electron excitation by light, a power generator using electron excitation by heat, and a power generator using vibration.

Further, the piezoelectric element according to the present disclosure may be applied to a pyroelectric device such as an infrared detector, a terahertz detector, a temperature sensor, or a thermal sensor, or a ferroelectric element such as a ferroelectric memory.

What is claimed is:

1. A piezoelectric element comprising:
   a first electrode formed at a substrate;
   a seed layer formed at the first electrode;
   a piezoelectric film containing potassium, sodium, and niobium and formed at the seed layer; and
   a second electrode formed at the piezoelectric film, wherein
   the piezoelectric film contains lithium and one or more first transition elements, the one or more first transition elements being at least one of scandium, titanium, vanadium, chromium, manganese, iron, cobalt, nickel, copper, and zinc,
   the seed layer contains bismuth, and
   when the piezoelectric film is divided into two equal parts in a stacking direction, the second electrode side is defined as a first region, and the first electrode side is defined as a second region, a bismuth intensity obtained by SIMS measurement at a boundary between the first region and the second region is equal to or less than 1/500 of a maximum bismuth intensity obtained by the SIMS measurement of the piezoelectric film.

2. The piezoelectric element according to claim 1, wherein
   the seed layer contains titanium, iron, and lead.

3. The piezoelectric element according to claim 2, wherein
   a thickness of the seed layer is smaller than a thickness of the first electrode in the stacking direction.

4. The piezoelectric element according to claim 1, wherein
   the piezoelectric film is preferentially oriented in a (100) plane.

5. A droplet dispensing head comprising:
   the piezoelectric element according to claim 1;
   a substrate;
   a nozzle plate in which a nozzle for dispensing droplets is formed; and
   a pressure chamber substrate forming a pressure chamber communicating with the nozzle, wherein
   the substrate forms a part of a wall surface of the pressure chamber, and
   the piezoelectric element is formed at the substrate.

6. An actuator comprising:
   the piezoelectric element according to claim 1;
   a drive unit driven by the piezoelectric element; and
   a voltage application unit configured to apply a voltage to the piezoelectric element.

7. A vibrator comprising:
   the piezoelectric element according to claim 1; and
   a charge detection unit configured to detect an amount of charge generated by displacement of the piezoelectric element and output a signal corresponding to the amount of charge.

8. The piezoelectric element according to claim 1, wherein
   a content of the lithium contained in the piezoelectric film is 10 mol % or less.

9. The piezoelectric element according to claim 1, wherein
   the one or more first transition elements is at least one of the scandium, the vanadium, the chromium, and the nickel.

* * * * *